United States Patent Office 3,307,943
Patented Mar. 7, 1967

3,307,943
IMAGE REPRODUCTION ELEMENTS AND PROCESSES

Robert Bernard Heiart, Middletown, N.J., assignor to E. I. du Pont de Nemours and Company, Wilmington, Del., a corporation of Delaware No Drawing. Filed May 14, 1963, Ser. No. 280,457
3 Claims. (Cl. 96—28)

This invention relates to elements for image reproduction and more particularly to such elements wherein images are formed by photopolymerization techniques. This invention also relates to an image transfer process utilizing such elements. More particularly, this invention relates to elements which can be employed in such an image transfer process to produce copying masters for engineering reproduction use.

Reproduction of engineering drawings is conventionally accomplished by using silver halide wash-off products since the product thus obtained can be erased and corrected readily. However, this is a wet and, therefore, somewhat cumbersome process. Various elements useful for producing copies of an image by thermal transfer are known. Some of these elements, such as those disclosed in Burg and Cohen, U.S. 3,063,023, are useful primarily in forming images by dry addition photopolymerization reactions. Such elements are particularly useful in making office-copy reproductions, but are not designed for use in making engineering reproduction copies.

An object of this invention is to provide a novel element which may be used in new processes for forming images by photopolymerization. Another object of this invention is to provide a photopolymerizable element which is useful in preparing masters that can be printed with ultraviolet radiation. A further object is to provide an element which is sensitive to actinic radiation and which is capable of strongly attenuating ultraviolet radiation. Yet a further object of this invention is to provide photopolymerizable elements which undergo excellent thermal transfer to drafting film, tracing cloth, and drafting paper surfaces. Still further objects will be apparent from the following description of the invention.

The novel image-yielding elements of this invention comprise a support bearing a photopolymerizable stratum solid below 40° C., thermally transferable by having a transfer temperature above 18° C. and below 220° C. and comprising:

(a) An ethylenically unsaturated compound containing at least one terminal $CH_2{=}C<$ group, having a boiling point above 100° C. at normal atmospheric pressure and being capable of forming a high polymer by photoinitiated addition polymerization, (b) A free radical generating addition polymerization initiator system activatable by actinic radiation and inactive thermally below 85° C., and (c) An ultraviolet radiation absorber in such concentration as to absorb at least 80% of the radiant energy in some region of the ultraviolet spectrum from 180 to 380 millimicrons and providing an optical density less than 0.3 in a spectral region which is actinic for the initiator.

Optionally, the element may contain (d) A coloring material, preferably a dye, which absorbs radiation in part of the visible spectrum but which should not absorb strongly in a spectral region where the photoinitiator is activatable. The dye should not inhibit polymerization. It is desirable that the dye should impart to the element an optical density of at least 0.5 at a wavelength in the visible spectrum and an optical density less than 0.3 in a spectral region which is actinic for the initiator.

A preferred embodiment of the photopolymerizable element also comprises (e) A viscosity-modifying agent, preferably a thermoplastic compound solid at 50° C. Viscosity-modifying agents may either raise or lower the viscosity and stick temperature of the photopolymerizable composition and thus may include thermoplastic compounds (especially thermoplastic polymeric compounds), plasticizers and inert filler materials. Where this viscosity-modifying agent is present, components (a) and (e) are present in amounts from 3 to 97 and 97 to 3 parts by weight respectively.

In a particularly preferred composition there are present from 0.001 to 10 or more parts per hundred parts by weight of components (a) plus (e) of (b) a free-radical generating polymerization initiator activatable by actinic radiation. Also there may be present (f) 0.001 to 4.0 parts per hundred parts by weight of components (a) plus (e) of a thermal addition polymerization inhibitor. Elements particularly suited for use in making reflex copies may also contain sensitometric modifiers as disclosed in assignee's application, Heiart Ser. No. 186,221 now Patent No. 3,203,801 or Burg Ser. No. 186,222, now Patent 3,203,802 both filed April 9, 1962.

Ultraviolet absorbers useful in the photopolymerizable compositions of this invention include phenyl salicylate, t-butyl phenyl salicylate, 2,4-dihydroxy benzophenone, 2,4-dibenzoyl resorcinol, 2-hydroxy-4-methoxy benzophenone, 2,2'-dihydroxy-4-methoxy benzophenone, 2,2'-dihydroxy-4-octyloxy benzophenone, 2,2'-dihydroxy-4,4'-dimethoxybenzophenone and alkylated 2-hydroxyphenyl benzotriazole. Ultraviolet-absorbing pigments are also useful providing they have the required absorption and transmission characteristics.

Other useful ultraviolet absorbers include each of those described in Modern Plastics, Aug. 1959, pp. 117–121, in Schoenthaler et al. appln. Ser. No. 28,523 filed May 12, 1960, now Patent No. 3,214,463 and in U.S. Patents 2,868,812, 2,763,657 and 2,740,761. Preferred compounds have the formula:

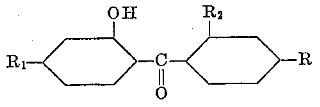

where $R_1$, $R_2$ and $R_3$ are each a member selected from the group consisting of —H, —OH and —O alkyl of 1–18 carbons.

A wide range of photopolymerizable compositions can be used in the preparation of the elements. In general, compositions are such that they do not soften at temperatures below 40° C. and do not undergo any essential change in softening temperature by holding up to 15 seconds at the original softening temperature of the composition.

Suitable viscosity-modifying agents (d) include thermoplastic compounds such as those disclosed in assignee's copending application, Burg, Ser. No. 234,214, filed Oct. 30, 1962, now Patent No. 3,203,805 e.g., copolyesters, polyamides, vinylidene chloride copolymers, cellulosic ethers, polyolefins, synthetic rubbers, cellulose esters, polyvinyl esters, polyacrylate esters, etc. Particularly useful thermoplastic compounds are alkyl methacrylate homopolymers and copolymers prepared from a mixture comprising at least 50 mole percent alkyl methacrylate monomers. Said mixture also comprises 0 to 50% alkyl acrylate esters, 0 to 25% acrylonitrile and 0 to 15% of an acid of the formula $CH_2{=}C(R){-}COOH$ wherein R is selected from —H, $—CH_3$ $—C_2H_5$ and $—CH_2—COOH$. When the photopolymerizable stratum comprises ethylenically unsaturated polymeric compositions capable of further polymerization or crosslinking, it is particularly desirable also to include plasticizing agents such as low molecular weight polyalkylene oxides, ethers and esters, e.g., triethyleneglycol dicaprolate, polypropylene glycol, methyl-n-butyl ether; and esters such as phthalates, e.g., dibutyl phthalate; adipates, e.g., diisobutyl adipate; and sebacates. In addition, phosphates, e.g., tricresyl phosphate; amides and sulfonamides, e.g., N-ethyl-p-toluenesulfonamide; carbonates, e.g., bis(dimethylbenzyl) carbonate; citrates, e.g., triethyl citrates; glycerol esters, e.g., glycerol triacetate; laurates, e.g., n-butyl laurate; oleates, stearates, etc.; and sucrose octaacetate are also useful.

To the thermoplastic polymer constituent of the photopolymerizable composition there can be added nonthermoplastic polymeric compounds to improve certain desirable characteristics, e.g., adhesion to the base support, adhesion to the image-receptive support on transfer, wear properties, chemical inertness, etc. Suitable nonthermoplastic polymeric compounds include polyvinyl alcohol, cellulose, anhydrous gelatin, phenolic resins and melamineformaldehyde resins. If desired, the photopolymerizable layers can also contain immiscible polymeric or non-polymeric organic or inorganic fillers or reinforcing agents which are essentially transparent at the wavelength used for exposure of the photopolymeric material, e.g., the organophilic silicas, bentonites, silica, powdered glass, colloidal carbon as well as various types of dyes and pigments. Such materials are used in amounts varying with the desired properties of the photopolymerizable layer. The fillers are useful in improving the strength of the composition, reducing tack and, in addition, as coloring agents.

The ethylenically unsaturated compound (a) which is capable of polymerizing or forming high polymer in a short period of time by photoinitiated, chain-propagating, addition polymerization can be any of the monomeric compounds disclosed in Plambeck U.S. Patent 2,760,863. Preferably the compounds are non-gaseous at 20° C. and atmospheric pressure, have at least one terminal ethylenic group, preferably two or more, and a plasticizing action on the thermoplastic in addition to its other properties disclosed above. Suitable compounds, which may be used alone or in combination, include, preferably, an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Patent 2,927,022, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, particularly the vinylidene groups, are conjugated with esters or amide structures. A number of suitable specific compounds are disclosed in the Burg application, Ser. No. 234,214, filed Oct. 30, 1962. Other suitable polymerizable compounds are the pentaerythritol esters disclosed in assignee's Celeste and Seide U.S. application Ser. No. 274,909, filed April 23, 1963, now Patent No. 3,261,686. An outstanding class of these preferred addition polymerizable components are the esters and amides of alpha-methylene carboxylic acids and substituted carboxylic acids with polyols and polyamides wherein the molecular chain between the hydroxyls and the amino groups is solely carbon or oxygen-interrupted carbons. The preferred monomeric compounds are di- or poly-functional, but monofunctional monomers can also be used. The amount of monomer added varies with the particular thermoplastic polymer used.

The ethylenic unsaturation can be present as an extra linear substituent attached to a thermoplastic linear polymer, such as polyvinyl acetate/acrylate, cellulose acetate/acrylate, cellulose acetate/methacrylate, N-acrylyloxymethylpolyamide, N-methylacrylyloxymethylpolyamide, N-acrylyloxyethylpolyamide, etc., in which case the monomer and polymer functions are combined in a single material.

A preferred class of free-radical generating addition polymerization initiators (b) activatable by actinic light and thermally inactive at and below 185° C. includes the substituted or unsubstituted polynuclear quinones which are compounds having two intracyclic carbonyl groups attached to intracyclic carbon atoms in a conjugated carbocyclic ring system. Suitable such initiators include, 9,10-anthraquinone and other anthraquinones, phenanthrenequinones, naphthoquinones, etc., certain aromatic ketones, e.g., benzophenones, etc. In addition, the following photoinitiators are also useful, some of which may be thermally active at temperatures as low as 85° C., e.g., those described in Plambeck U.S. Patent 2,760,863, and include vicinal ketaldonyl compounds, such as diacetyl, benzil etc.; alpha-ketaldonyl alcohols, such as benzoin, pivaloin, etc.; acyloin ethers, e.g., benzoin methyl and ethyl ethers, etc.; alpha-hydrocarbon substituted aromatic acyloins, including alpha-methylbenzoin, alpha-allylbenzoin and alpha-phenyl benzoin.

Other suitable photoinitiators are disclosed in the abovementioned Burg application, Ser. No. 234,214, as well as a number of suitable thermal polymerization inhibitors, the latter including such compounds as p-methoxyphenol, hydroquinone, cuprous chloride, pyridine etc.

Various dyes, pigments, thermographic compounds and color-forming components can be added to the photopolymerizable compositions to give varied results after the thermal transfer. These additive materials, preferably, should not absorb excessive amounts of radiation at the exposure wave length or inhibit the polymerization reaction. These coloring materials are useful in making the transferred image more readily visible for ease and convenience of handling the master as it is used in the subsequent operation for preparing copies such as blueprints or diazo prints. Visible coloring matter is not required to supplement the action of the ultraviolet-absorbing image in modulating exposure to make the final print, but an image which is made more visible to the human eye is obviously one with which it is easier to work. Many useful dyes, pigments, thermographic additives, and color-forming components are disclosed in the above Burg application, Ser. No. 234,214.

The photopolymerizable composition is preferably coated on a sheet support. The support material should be stable at the operating temperatures used in the present invention. Suitable bases or supports include those disclosed in U.S. Patent 2,760,863, and glass, wood, paper, (including waxed or transparent paper), cloth, cellulose esters, e.g., cellulose acetate, cellulose propionate, cellulose butyrate, etc., and other plastic compositions such as polyamides, polyesters, e.g., polyethylene terephthalate; polyolefins, e.g., polyethylene and polypropylene. The support may have in or on its surface and beneath the photopolymerizable stratum an antihalation layer as disclosed in said patent or other substrata needed to facilitate anchorage to the base and/or may have an antiblocking or release coating on the back surface, e.g., finely divided inert particles in a polymeric binder, for instance, silica in gelatin.

The elements described above may be exposed with less intense radiation by using a vacuum printing frame so as to decrease the concentration of the polymerization-inhibiting oxygen in the atmosphere. The same effect can be obtained without a vacuum printing frame if one uses a strippable, transparent cover sheet such as described in Heiart, U.S. Patent 3,060,026, or if one uses a thermally transferable cover stratum comprising at least one wax as described in the above Burg application, Ser. No. 234,214, filed Oct. 30, 1962.

The above-described element may be used in an image-reproducing process including the steps of exposing said element imagewise to actinic radiation at atmospheric conditions until polymerization, with an accompanying increase in stick temperature of the photopolymerizable stratum takes place in the exposed image areas with substantially less polymerization and less increase in stick temperature in the underexposed complementary coplanar image areas to provide a difference of at least 10° C. in the stick temperatures of said exposed and underexposed areas; and transferring said image corresponding to the underexposed areas by bringing the surface of the exposed element into operative contact with the surface of an image-receptive support at an operating temperature intermediate between the stick temperatures of said exposed and underexposed areas and subsequently separating the two surfaces at a temperature intermediate between the stick temperatures of the exposed and underexposed image areas.

The term "underexposed" as used herein is intended to cover the image areas which are completely unexposed or those exposed only to the extent that there is addition polymerizable compound still present in sufficient quantity that the softening temperature remains substantially lower than that of the complementary exposed image areas. The term "stick temperature," as applied to either an underexposed or exposed area of a photopolymerizable stratum, means the minimum temperature at which the image area in question sticks or adheres (transfers), within 5 seconds, under slight pressure, e.g., thumb pressure, to analytical paper (Schleicher & Schull analytical filter paper No. 595) and remains adhered in a layer of at least detectable thickness after separation of the analytical paper from the stratum.

Prior to the transfer step, the layer is exposed to actinic radiation. This may be through a two-tone image or a process transparency, e.g., a process negative or positive (an image-bearing transparency consisting solely of substantially opaque and substantially transparent areas where the opaque areas are substantially of the same optical density, the so-called line or halftone negative or positive) or a stencil. The image or transparency may or may not be in operative contact with the protective cover sheet, e.g., contact exposure or projection exposure. It is possible to expose through paper or other light transmitting materials. A stronger radiation source or longer exposure times must be used, however.

Reflex exposure techniques are especially useful in the present invention. By using reflex exposure, copies can be made from materials having messages on both sides of a page or from opaque supports, e.g., paper, cardboard, metal, etc., as well as from poor light transmitting surfaces with no loss in speed, excellent resolution, and in addition, right reading copies are obtained directly on transfer.

Since the present elements contain a substantial concentration of ultraviolet-absorbing materials, the actinic radiation must either be in the visible spectrum or in a region of the ultraviolet spectrum where the UV absorber is fairly transparent. Suitable exposing sources include carbon arcs, mercury vapor arcs, fluorescent lamps (particularly with phosphors which emit strongly in wavelength regions to which the element is sensitive) argon glow lamps, electronic flash units and photographic flood lamps. Of these, the fluorescent lamps are especially suitable.

After the exposure of the photopolymerizable layer, the exposed composition is brought into intimate contact with an image-receptive support while heat and pressure are applied to effect the transfer of the underexposed areas of the photopolymerizable composition. While the heat is preferably applied simultaneously with the contact of the exposed element to the receptive support, it may be applied at any stage of the process prior to the separation step to either or both elements provided: (1) that at no time during contact of the two elements does the operating temperature of the light-sensitive element exceed the stick temperature of the exposed areas and (2) that at the time of separation of the two elements, the temperature of the light-sensitive element is intermediate between the stick temperatures of the underexposed and exposed areas of the photopolymerizable stratum. Heat can be applied by means well known to the art, e.g., rollers, flat or curved heating surfaces or platens, radiant sources, e.g., heating lamps, etc.

The duration of contact of the photopolymerizable element and the image-receptive surface can range from 0.01 to 10 seconds. In general about 0.1 second is adequate and shorter periods of contact are possible by using an intense radiant source of heat, e.g., infrared lamps or heat sources.

The image-receptive support to which the image is transferred must be stable at the operating temperatures. The particular support used is dependent on the desired use for the transferred image and on the adhesion of the image to the base. To be useful for making blueprint or diazo copies, the receptor paper should be translucent at the wavelengths used in these processes, i.e., in the ultraviolet region of the spectrum. Most tracing papers, tissues and cloths known in the art are suitable for the purpose. The translucent drafting films which have a polymeric support and a coating are particularly suitable since they are not especially porous. This causes the transferred message to remain on the surface where it is readily erased if corrections are desired. Particularly useful as image-receptive supports are the drafting films described in Van Stappen, U.S. 2,964,423.

In practicing a preferred embodiment of the invention a photopolymerizable element, as described above, is exposed to actinic radiation reflectographically to a reflective surface bearing a light-absorbing message (or to a light-absorbing surface bearing a light-reflecting message) or by transmission through a drawing or a photographic process transparency, e.g., a photographic positive, negative, halftone, or a light-transmitting paper. The exposed image-yielding element is then brought into intimate contact under pressure at the operating temperature, e.g., a temperature in the range of 40° to 220° C. or more, with the surface of an image-receptive support, e.g., paper, metal, synthetic polymer, screen, etc., and, while still warm, the surfaces are separated. The thermoplastic photopolymerizable composition is transferred in the areas corresponding to the underexposed thermally transferable areas to the receptive support, e.g. paper, to give at least one copy of the original image. Multiple copies can be obtained by repeating the heat transfer procedure using appropriate coating thicknesses of the photosensitive layer, pressures and temperatures to give the desired number of copies.

The copy obtained by the procedure described above contains an imagewise distribution of an ultraviolet-absorbing material (and optionally, for ease of handling, a visible image as well) which may now be used as an intermediate element or "master" for making engineering copies by such processes as blueprinting and diazo reproduction.

The invention will be further illustrated by, but is not intended to be limited to, the following detailed examples wherein the abbreviation C.I. refers to the Colour Index 2nd Edition 1956, The Society of Dyers and Colourists, Dean House, Picadilly, Bradford, Yorkshire, England, and the American Association of Textile Chemists and Colorists, Lowell Technological Institute, Lowell, Massachusetts, U.S.A.

*Example I*

The following coating solution was prepared by stirring slowly for 30 minutes at room temperature:

| | G. |
|---|---|
| Polyethylene glycol diacrylate | 10.0 |
| Cellulose acetate butyrate | 10.0 |
| Ultraviolet absorber, 2,2'-dihydroxy-4,4'-dimethoxy benzophenone | 2.0 |
| "Calcoid" Green S Dye (C.I. Acid Green 50) | 0.1 |
| Phenanthrenequinone (photoinitiator) | 0.2 |
| Acetone to bring solution weight to 60.0 g. | |

The cellulose acetate butyrate contained ca. 13% acetyl groups, ca. 37% butyryl groups and had a viscosity of 1.12 to 1.88 poises as determined by ASTM method D–1343–54T in the solution described as Formula A, ASTM method D–871–54T, and had a specific gravity of 1.20. The polyethylene glycol diacrylate was derived from polyethylene glycol with an average molecuar weight of 300. This solution was coated on a 0.001-inch thick polyethylene terephthalate film support to give a coating having a dry thickness of 0.0002 inch. The dried coating was placed in a uniform surface contact with another sheet of 0.001 inch thick polyethylene terephthalate film base and lamination of this cover sheet was effected by pressing at room temperature with a rubber squeegee. This temporary lamination serves to decrease the inhibiting effect of oxygen on photopolymerization.

The laminated element was then given a reflex exposure to a black and white original, using a 2800-watt carbon arc for one second at a distance of 12 inches. After exposure, the element was delaminated, placed face down in contact with a like-sized sheet of engineering drafting film and the superimposed elements were passed through pressure rollers at 119° C. and 5 lbs. of force per lineal inch of the rollers. The engineering drafting film was of the type described in Van Stappen, U.S. 2,964,423.

When subjected to heat and pressure, the underexposed areas of the photopolymerizable stratum transferred to the surface of the engineering drafting film to give a green positive copy of the original image on the engineering drafting film.

The copy thus obtained on drafting film was used as a "master" in making a diazo-copy using commercially available, ultraviolet-sensitive diazo paper. The exposure, and subsequent "fixing" in ammonia fumes, were carried out in a commercially available "Ozalid Print-Master-810" machine purchased from the General Aniline and Film Co. A very satisfactory positive copy of the original image was obtained on the diazo paper.

A similar drafting film "master" was used to modulate the ultraviolet exposure in a conventional blue print process to form a very satisfactory print on standard blueprint paper. A two-minute exposure was made in a Nu-Arc "Plate Maker" (Nu-Arc Co., Inc., 824 S. Western Avenue, Chicago, Ill.) in which the carbon arc was located at a distance of 36 inches from the ultraviolet-sensitive blueprint paper. The exposed paper was conventionally developed and dried to give a very satisfactory negative blueprint of the original.

It is noted that the green dye in the photopolymerizable element did not absorb enough actinic radiation to appreciably lower the sensitivity of the element during the reflex exposure. In the secondary exposure, i.e., the exposure of the thermally transferred image to produce a copy by the blueprint or diazo process, the exposing radiation was modulated by the ultraviolet absorbing benzophenone derivative which had been imagewise thermally transferred.

*Example II*

A solution was prepared from the following materials:

| | G. |
|---|---|
| Pentaerythritol triacrylate | 2.0 |
| Polymethylmethacrylate | 3.0 |
| Ultraviolet absorbing dye | 1.0 |
| "Pontacyl" Wool Blue BL Dye (C.I. Acid Blue 59) | 0.1 |
| 2-ethyl anthraquinone | 0.1 |

The polymethylmethacrylate was a white granular solid, having a specific gravity of 1.19 and a refractive index of 1.493 at 25° C. Its heat distortion temperature at 264 lbs. per square inch was 72° C. by the ASTM method D–648–45T. The ultraviolet absorbing dye, with narrow absorption peaks at 367 and 383 millimicrons, was [3-methyl - 2-benzoxazole] [3-methyl-5-phenyl-2-benzoxazole] cyanine bromide. This cyanine dye was prepared by reacting the dimethyl sulfate salts of 3-methyl-5-phenylbenzoxazole and 3-methylmercaptobenzoxazole in boiling ethanol to which triethylamine was added to make the solution basic. The dye was precipitated as the bromide by addition of an aqueous potassium bromide solution, filtered, washed with water and purified by recrystallization from ethanol.

The solution was prepared and coated on 0.001-inch thick polyethylene terephthalate film, as described in Example I. The dried coating was not laminated but placed in a vacuum printing frame and exposed for 10 seconds by transmission using a 2800-watt carbon arc at a distance of 15 inches as the exposure source.

The exposed element was removed from the vacuum frame, placed in contact with a sheet of drafting paper and the superposed elements were passed through pressure rollers at 118° C. and 3 lbs. per lineal inch of the rollers. The drafting paper was separated from the coated film as it emerged from the rollers, giving a clear, sharp, positive, blue copy of the original image.

This thermally transferred copy was used as a "master" for making satisfactory copies by both the blueprint and diazo processes as described in Example I.

*Example III*

A solution was prepared from the following materials:

| | G. |
|---|---|
| 2-hydroxyethylmethacrylate | 4.0 |
| Dibutyl phthalate | 2.0 |
| Polyvinyl butyral | 2.0 |
| Benzoin methyl ether (initiator) | 0.2 |
| Crystal Violet Dye (C.I. Basic Violet 3) | 0.1 |
| "Pontamine" White CL (C.I. Fluorescent Brightening Agent 26, absorption peak at 375 millimicrons, an ultraviolet radiation absorber) | 1.0 |

Methylene chloride was added to bring the solution weight to 35.0 g. The polyvinyl butyral had a molecular weight of 4100, a minimum hydroxyl content of 18% (as polyvinyl alcohol), 1% acetate (as polyvinyl acetate), and approximately 80% butyral (as polyvinyl butyral). The specific gravity was 1.1, and the viscosity was 195 cps. in an Ostwald viscometer (10% by weight solution in 95% ethanol at 25° C.).

The solution was prepared, coated and dried as in Example II. Exposure was as in Example II except that the time was 20 seconds. The thermal transfer conditions of Example II were repeated and a clear, sharp, violet colored copy of the original image was obtained on drafting paper. Both diazo and blueprint copies were made from the print, following the procedure of Example I.

*Example IV*

A solution was prepared from the following materials:

| | G. |
|---|---|
| Triethylene glycol diacrylate | 5.0 |
| Cellulose acetate butyrate as used in Example I | 6.0 |
| 2-hydroxy-4-methoxybenzophenone, an ultraviolet absorbing compound | 2.0 |
| "Pontacyl" Wool Blue BL Dye (C.I. Acid Blue 59) | 0.1 |
| Phenanthrenequinone (initiator) | 0.1 |
| Acetone to bring solution weight to 35.0 g. | |

The solution was prepared, coated, dried, exposed and thermally transferred to a sheet of drafting paper following the procedure of Example II, to yield a clear sharp blue copy of the original image. A good blueprint copy was made from this print following the procedure of Example I, but the ultraviolet absorbing compound in the thermally transferred image did not absorb at a wavelength suitable for use in preparing a diazo copy.

*Example V*

Example I was essentially repeated except for the omission of the green dye (C.I. Acid Green 50) from the coating composition. The photopolymerizable stratum was transferred to the surface of a sheet of engineering drafting film, as described in Example I, with similar results except that the resulting positive copy was not as highly visible as when it was colored with a green dye as in the earlier example. However, the image was equally capable of modulating ultraviolet radiation so that a comparable diazo copy was obtained when the image was used as a master, following the identical procedure described in Example I.

*Example VI*

A coating solution was prepared by stirring together the following at room temperature:

| | G. |
|---|---|
| 28.4% by weight solution of polymethyl methacrylate in benzene | 11.3 |
| Pentaerythritol triacrylate | 2.45 |
| Triethylene glycol diacrylate | 1.0 |
| Ultraviolet absorber, 2,2′-dihydroxy-4,4′-dimethoxy benzophenone | 1.0 |
| Phenanthrenequinone | 0.2 |

Methyl ethyl ketone to bring total weight of solution to 40 g.

The polymethyl methacrylate was prepared by dissolving the initiator, azo-bis-isobutyronitrile, in methyl methacrylate monomer to form a 1% by weight solution and charging this solution over a 2-hour period to the refluxing solvent (benzene). Refluxing was continued overnight. A sample of the resulting polymer, isolated as a dry solid, was found to have a polymer melt temperature of 165° C.

The above solution was coated, dried and laminated with a cover sheet as described in Example I. It was then exposed by transmission as described in Example II. Next, the element was delaminated and thermally transferred to drafting paper as described in Example I. When light was reflected from the drafting film at certain angles it was possible to detect a positive copy of the original image even though there was no dye present in the photopolymerizable composition to enhance the visibility of the image. The thermally transferred copy was used as a "master" for making satisfactory copies by both the blueprint and diazo processes as described in Example I. It was noted that the adhesion of the thermally transferred material to the drafting paper surface was exceptionally strong, this adhesion evidently being attributable to the properties of the polymethyl methylacrylate binder.

*Example VII*

A coating solution was prepared by stirring together the following at room temperature:

| | G. |
|---|---|
| 25.3% by weight solution in methyl ethyl ketone of a copolymer | 12.79 |
| Pentaerythritol triacrylate | 2.0 |
| Triethylene glycol diacrylate | 1.0 |
| Ultraviolet absorber, 2,2′-dihydroxy-4,4′-dimethoxy benzophenone | 1.0 |
| Phenanthrenequinone | 0.2 |

Methyl ethyl ketone to bring total weight of solution to 40 g.

The above copolymer was prepared from a polymerization mixture containing, on a molar basis, 98.5 parts of methyl methacrylate per 1.5 parts of methacrylic acid. Azo-bis-isobutyronitrile was used as the initiator, dissolved in the monomers as a 1% by weight solution. The monomer-initiator solution was charged over a 2-hour period to the refluxing solvent (methyl ethyl ketone) and refluxing was continued overnight. A sample of the resulting polymer, isolated as a dry solid, was found to have a polymer melt temperature of 168° C.

The composition was coated and the resulting coating was treated as described in the previous example with very similar results being obtained. Again it was observed that there was very excellent adhesion between the thermally transferred material (containing the copolymer binder) and the surface of the drafting paper.

The novel elements of this invention are specifically designed for use in preparing intermediate images which can be used as masters in various photoreproduction processes involving exposure by ultraviolet radiation. There include blueprint processes, both negative and positive, diazo processes and the vandyke process. Such processes require the presence in the photopolymerizable stratum of an ultraviolet absorbing compound. The elements are also useful in a variety of other applications wherein the ultraviolet absorbing compound is not required but yet causes no harm by its presence. Thus these elements can be used in the dusting and stripping processes disclosed in Burg and Cohen, U.S. Patents 3,060,024 and 3,060,025, respectively.

The preferred elements which contain, additionally, a colorant absorbing in the visible spectrum, can be used in the more specific applications of this invention (i.e., in preparing masters for blueprinting, etc.) but are also useful in a variety of other applications such as copying, printing, decorating and manufacturing. Pigments, e.g. $TiO_2$, colloidal carbon, metal powders, phosphors, etc., and dyes which do not appreciably absorb actinic radiation at the wavelength being used for exposure or inhibit polymerization can be incorporated in the light-sensitive photopolymerizable layer, and by use of the above-described process, images can be transferred to a receptor support. Multicopies of the process images can be obtained from the transferred image. The number of copies prepared is dependent on the photopolymerizable composition thickness as well as the process conditions. The element is also useful for making multicolor reproduction. Colorless constituents which form colored compounds when heat is applied or when brought into contact with other color forming components are useful in conjunction with the element.

Lithographic surfaces can be produced by thermally transferring a hydrophobic layer of the element to a hydrophilic receptor surface or vice versa. The images on the lithographic surface can be made impervious to chemical or solvent attack by postexposing the lithographic surface. Alternatively, the exposed areas of the photopolymerizable element, after the underexposed areas are transferred, can be used as a lithographic-offset printing plate if they are hydrophobic and the original sheet support is hydrophilic or vice versa. The element and process are also useful for making silk screens.

The elements of this invention have the advantage of great versatility. Although primarily intended for use in the field of engineering reproduction (blueprinting, diazo copying, etc.), these elements can be used in essentially any of the other image-forming applications involving thermal transfer as discussed above.

In the specific field of engineering reproduction, these elements make it possible to prepare ultraviolet radiation modulating masters by a simple, dependable, dry process either by reflux exposure or by exposure through a transparency. When such masters are prepared by thermal transfer of an image to the preferred type of engineering drafting film as the receptor surface, the master can easily be corrected or altered since the image is erasable (using an ordinary rubber pencil or ink eraser). Pen or pencil additions are readily made to the receptive, toothed surface of the drafting film.

Still further advantages will be apparent to those skilled in the art of image formation.

I claim:

1. A process which comprises (A) exposing, imagewise, to actinic radiation a photopolymerizable element comprising (1) a support and (2) a photopolymerizable stratum solid below 40° C., thermally transferable by having a transfer temperature above 18° C. and below 220° C., said layer comprising:

(a) an ethylenically unsaturated compound containing at least one terminal $CH_2{=}C<$ group, having a boiling point above 100° C. at normal atmospheric pressure and being capable of forming a high polymer by photo-initiated addition polymerization, (b) a free radical generating addition polymerization initiator system activatable by actinic radiation and inactive thermally below 85° C., and (c) an ultraviolet radiation absorber in such concentration as to absorb at least 80% of the radiant energy in some region of the ultraviolet spectrum from 180 to 380 millimicrons and providing an optical density less than 0.3 in a spectral region which is actinic for the initiator;

until polymerization with an accompanying increase in stick temperature of the photopolymerizable stratum takes place in the exposed image areas with substantially less polymerization and less increase in stick temperature in the underexposed complementary coplanar image areas to provide a difference of at least 10° C. in the stick temperatures of said exposed and underexposed areas;

(B) transferring said image corresponding to the underexposed areas by bringing the surface of the exposed element into operative contact with the surface of an image-receptive support at an operating temperature intermediate between the stick temperature of said exposed and underexposed areas;

(C) subsequently separating the two surfaces at a temperature intermediate between the stick temperatures of the exposed and underexposed image areas, and (D) exposing a radiation-sensitive element by means of radiation embodying ultraviolet rays through the element containing the transferred image.

2. A process according to claim 1 wherein the element has a thin, flexible, transparent support.

3. A process which comprises (A) exposing, imagewise, to actinic radiation a photopolymerizable element comprising (1) a support and (2) a photopolymerizable stratum solid below 40° C., thermally transferable by having a transfer temperature above 18° C. and below 220° C., said layer comprising:

(a) an ethylenically unsaturated compound containing at least one terminal $CH_2{=}C<$ group, having a boiling point above 100° C. at normal atmospheric pressure and being capable of forming a high polymer by photo-initiated addition polymerization, (b) a free radical generating addition polymerization initiator system activatable by actinic radiation and inactive thermally below 85° C., and (c) an ultraviolet radiation absorber in such concentration as to absorb at least 80% of the radiant energy in some region of the ultraviolet spectrum from 180 to 380 millimicrons and providing an optical density less than 0.3 in a spectral region which is actinic for the initiator;

until polymerization with an accompanying increase in stick temperatures of the photopolymerizable stratum takes place in the exposed image areas with substantially less polymerization and less increase in stick temperatures in the underexposed complementary coplanar image areas to provide a difference of at least 10° C. in the stick temperatures of said exposed and underexposed areas;

(B) transferring said image corresponding to the underexposed areas by bringing the surface of the exposed element into operative contact with the surface of an image-receptive, ultraviolet radiation transmitting support at operating temperatures intermediate between the stick temperatures of said exposed and underexposed areas;

(C) subsequently separating the two surfaces at a temperature intermediate between the stick temperatures of the exposed and underexposed image areas, and (D) exposing a light-sensitive paper selected from the group consisting of blueprint and diazo papers by means of ultraviolet radiation through the element containing the transferred image.

References Cited by the Examiner

UNITED STATES PATENTS

| | | | |
|---|---|---|---|
| 3,042,518 | 7/1962 | Wainer | 96—115 |
| 3,060,023 | 10/1962 | Burg et al. | 96—28 |
| 3,060,026 | 10/1962 | Heiart | 96—28 |
| 3,099,558 | 7/1963 | Levinos | 96—115 |
| 3,198,633 | 8/1965 | Cohen et al. | 96—115 XR |

References Cited by the Applicant

UNITED STATES PATENTS

| | | |
|---|---|---|
| 3,060,024 | 10/1962 | Burg et al. |
| 3,060,025 | 10/1962 | Burg et al. |

NORMAN G. TORCHIN, *Primary Examiner.*

A. E. TANENHOLTZ, J. RAUBITSCHEK, *Assistant Examiners.*